United States Patent
Phipps et al.

[11] Patent Number: 6,054,330
[45] Date of Patent: Apr. 25, 2000

[54] METHOD FOR PROTECTING A MAGNETORESISTIVE SENSOR ELEMENT

[75] Inventors: Peter Beverley Phipps, Saratoga; Erhard Theodor Schreck, San Jose; Albert John Wallash, Morgan Hill, all of Calif.

[73] Assignee: International Business Machines Corporation, Armonk, N.Y.

[21] Appl. No.: 08/985,464

[22] Filed: Dec. 4, 1997

Related U.S. Application Data

[62] Division of application No. 08/519,584, Aug. 25, 1995, Pat. No. 5,638,237.

[51] Int. Cl.[7] .................................................. H01L 21/00
[52] U.S. Cl. ................................................. 438/3; 438/132
[58] Field of Search ........................... 438/3, 4, 13, 48, 438/128, 129, 130, 132, 381, 382; 360/113; 361/212, 220

[56] References Cited

U.S. PATENT DOCUMENTS

| | | | |
|---|---|---|---|
| 4,317,149 | 2/1982 | Elser et al. | 360/126 |
| 4,785,366 | 11/1988 | Krounbi et al. | 360/113 |
| 4,800,454 | 1/1989 | Schwarz et al. | 360/103 |
| 4,801,558 | 1/1989 | Simmons et al. | 437/170 |
| 5,100,829 | 3/1992 | Fay et al. | 437/60 |
| 5,206,590 | 4/1993 | Dieny et al. | 324/252 |
| 5,272,582 | 12/1993 | Shibata et al. | 360/113 |
| 5,465,186 | 11/1995 | Bajorek et al. | 360/113 |
| 5,491,605 | 2/1996 | Hughbanks et al. | 360/113 |
| 5,559,051 | 9/1996 | Voldman et al. | 438/3 |
| 5,757,591 | 5/1998 | Carr et al. | 360/113 |
| 5,812,357 | 9/1998 | Johansen et al. | 361/212 |

FOREIGN PATENT DOCUMENTS 5-62129  3/1993  Japan .

OTHER PUBLICATIONS

G. K. Fedder et al., "Thermal Assembly of Polysilicon Microactuators With Narrow–Gap Electrostatic Comb Drive," Tech Digest, IEEE, Solid State Sensor & Actuator Workshop (Cat#92TH0403–X), 1992, pp. 63–68.

H. R. Greaves et al., "Electro Static Discharge Protection for Magneto Resistive Head/Arm Assembly," IBM Technical Disclosure Bulletin, vol. 36, No. 12, Dec. 1993, pp. 271–272.

*Primary Examiner*—Tuan H. Nguyen
*Attorney, Agent, or Firm*—Paik Saber

[57] ABSTRACT

In a magnetic read/write assembly, a removable fusible-link shorts the magnetoresistive (MR) sensor element to minimize electrical current through the MR sensing element during discharge of static electricity. Other magnetic head assembly elements such as the write coil and MR magnetic shields are also shorted using fusible-links. The fusible-link is removable during the assembly process. The existing terminal pads and wires are used to remove the fusible-link.

10 Claims, 7 Drawing Sheets

METHOD FOR PROTECTING A MAGNETORESISTIVE SENSOR ELEMENT

This is a divisional of application Ser. No. 08/519,584 filed Aug. 25, 1995, now U.S. Pat. No. 5,638,237.

BACKGROUND OF THE INVENTION

The present invention relates generally to electrical protection circuitry for magnetic disk drives and more particularly to methods and apparatus using fusible-links to protect against electrostatic discharge in read/write transducers utilizing magnetoresistive read sensors.

Magnetic head disk drive systems have been widely accepted in the computer industry as a cost effective form of data storage. In a magnetic disk drive system a magnetic recording medium, in the form of a disk, rotates at high speed while a magnetic read/write transducer, referred to as a magnetic head, "flies" slightly above the surface of the rotating disk. The magnetic disk is rotated by means of a spindle drive motor. The magnetic head is attached to, or formed integrally with, a "slider" which is suspended over the disk by a spring-loaded suspension attached to a support arm known as the actuator arm. As the magnetic disk rotates at operating speed, the moving air generated by the rotating disk in conjunction with the physical design of the slider operate to lift the magnetic head allowing it to glide or fly slightly above and over the disk surface on a cushion of air, referred to as an air bearing. The flying height of the magnetic head over the disk surface is typically only a few microinches or less and is primarily a function of disk rotation speed, the aerodynamic properties of the slider assembly and the force exerted by the spring-loaded actuator arm.

Thin film heads are particularly susceptible to damage from electrostatic discharge. A major problem that is encountered during manufacture, handling and use of magnetic recording transducers, referred to as heads, is the buildup of electrostatic charges on the various elements of a head or other objects which come into contact with the heads and the accompanying spurious discharge of the static electricity thus generated. For example, static charges may be produced by the presence of certain materials, such as plastics, during manufacture and subsequent handling of the heads. These static charges arc across the edge of the insulating layer between the magnetic pole tips and adjacent conductive layers which are exposed and positioned adjacent to the transducing gap at the air bearing surface facing the recording medium thus causing erosion of the pole tips and degradation of the transducer in reading and writing of data.

The above-described electrostatic discharge (ESD) problems associated with thin film inductive read/write heads are well-documented and several solutions have been proposed. Commonly assigned U.S. Pat. No. 4,317,149 issued to Elser et al discloses an inductive head having short discharge paths formed by the deposition of conductive material in the recesses formed in an insulating layer so that the static electric discharge will occur in areas displaced from the critical pole tip and gap area at the slider air bearing surface. U.S. Pat. No. 4,800,454 issued to Schwarz et al discloses an inductive head assembly wherein the magnetic pole piece and the inductive winding is coupled to the slider body to allow discharge of any static electric charges which may build up. A diode, with high forward and reverse voltage drops, or a fusible-link connects the slider body to the inductive winding. Schwarz et al also teach a method of opening the fusible-link by applying current between a signal lead and the slider body.

Magnetoresistive (MR) sensors are well known and are particularly useful as read elements in magnetic transducers, especially at high recording densities. The MR read sensor provides a higher output signal than an inductive read head. This higher output signal results in a higher signal to noise ratio for the recording channel and thus allows greater areal density of recorded data on a magnetic disk surface to be achieved. As described above, when an MR sensor is exposed to ESD, or even a voltage or current input larger than that intended under normal operating conditions, referred to as electrical overstress or EOS, the MR read sensor and other parts of the head may be damaged. This sensitivity to electrical damage is particularly severe for MR read sensors because of these sensors' relatively small physical size. For example, an MR sensor used for extremely high recording densities will have a cross-section of 100 Angstroms (Å) by 1.0 micrometers (um) or smaller. Accidental discharge of voltages of only a few volts through such a physically small resistor is sufficient to produce currents capable of severely damaging or completely destroying the MR sensor. The nature of the damage which may be experienced by an MR sensor varies-significantly, including complete destruction of the sensor via melting and evaporation, contamination of the air bearing surface, generation of shorts via electrical breakdown, and milder forms of damage in which the head performance may be degraded. This type of damage has been found to occur during both processing and use and poses a serious problem in the manufacturing and handling of magnetic heads incorporating MR read sensors.

SUMMARY OF THE INVENTION

A principal object of the present invention is to minimize damage to an MR sensor caused by discharge of static electricity through or electrical overstress of the MR sensor element, or other transducer components, by using a removable fusible-link to short the MR sensor.

In view of the foregoing object, the present invention shorts the MR sensor with a removable fusible-link during fabrication to provide ESD protection. In addition, the present invention uses existing terminal pads to supply current to open the fusible-link. To further minimize damage to the MR sensor, the present invention shorts the write coil and shields, using fusible-links. The fusible-links are removed prior to use in a magnetic storage system.

BRIEF DESCRIPTION OF THE DRAWINGS

The foregoing and other objects, features and advantages of the present invention will be apparent from the following detailed description of the preferred embodiments of the invention, reference being made to the accompanying drawing, in which like reference numerals indicate like parts and in which.

DETAILED DESCRIPTION OF THE PREFERRED EMBODIMENTS

Figure 1:
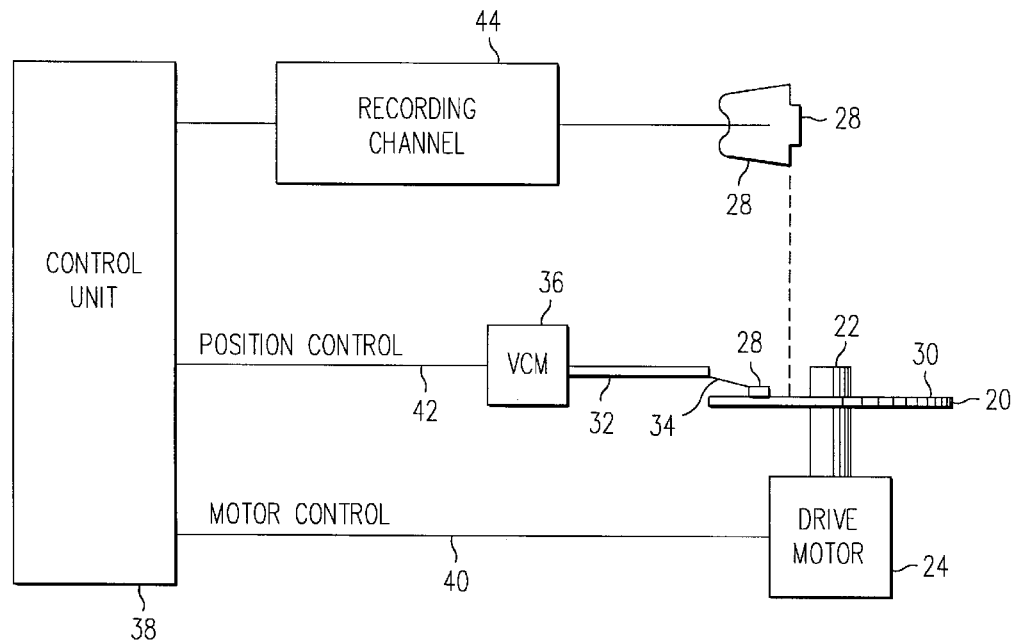
FIG. 1 is a simplified block diagram of a magnetic disk storage system embodying the present invention.

Although the invention is described as embodied in a magnetic disk storage system as shown in FIG. 1, the invention also applies to other magnetic recording systems and applications using a sensor to detect a magnetic field, such as magnetic tape recording systems for example. Referring to FIG. 1, a magnetic disk storage system comprising at least one rotatable magnetic disk 20 is supported on a spindle 22 and rotated by a disk drive motor 24 with at least one slider 26 positioned on the disk 20. Each slider 26 supports one or more magnetic read/write transducers 28, typically referred to as read/write heads. The magnetic recording media on each disk is in the form of an annular pattern of concentric data tracks (not shown) on disk 20. As the disks rotate, the sliders 26 are moved radially in and out over the disk surface 30 so that the heads 28 may access different portions of the disk where desired data is recorded. Each slider 26 attaches to an actuator arm 32 by means of a suspension 34. The suspension 34 provides a slight spring force which biases the slider against the disk surface 30. Each actuator arm 32 attaches to an actuator means 36. The actuator means as shown in FIG. 1 may be a voice coil motor (VCM), for example. The VCM comprises a coil moveable within a fixed magnetic field. The controller supplies motor current signals to control the direction and velocity of the coil movements.

During operation of the disk storage system, the rotation of the disk 20 generates an air bearing between the slider 26 and the disk surface 30 which exerts an upward force or lift on the slider. The air bearing thus counterbalances the slight spring force of the suspension 34 and supports the slider off and slightly above the disk surface a small, substantially constant spacing during operation.

The various components of the disk storage system are controlled in operation by control signals generated by control unit 38, such as access control signals and internal clock signals. Typically, the control unit 38 comprises logic control circuits, storage means and a microprocessor, for example. The control unit 38 generates control signals to control various system operations such as drive motor control signals on line 40 and head position and seek control signals on line 42. The position control signals 42 provide the desired current profiles to optimally move and position a selected slider 26 to the desired data track on the associated disk 20. A recording channel 44 communicates read and write signals to and from the read/write heads 28.

The above description of a typical magnetic disk storage system, and the accompanying illustration of FIG. 1 are for representation purposes only. Disk storage systems may contain a large number of disks and actuators, and each actuator may support a number of sliders.

Figures 2A, 2B:
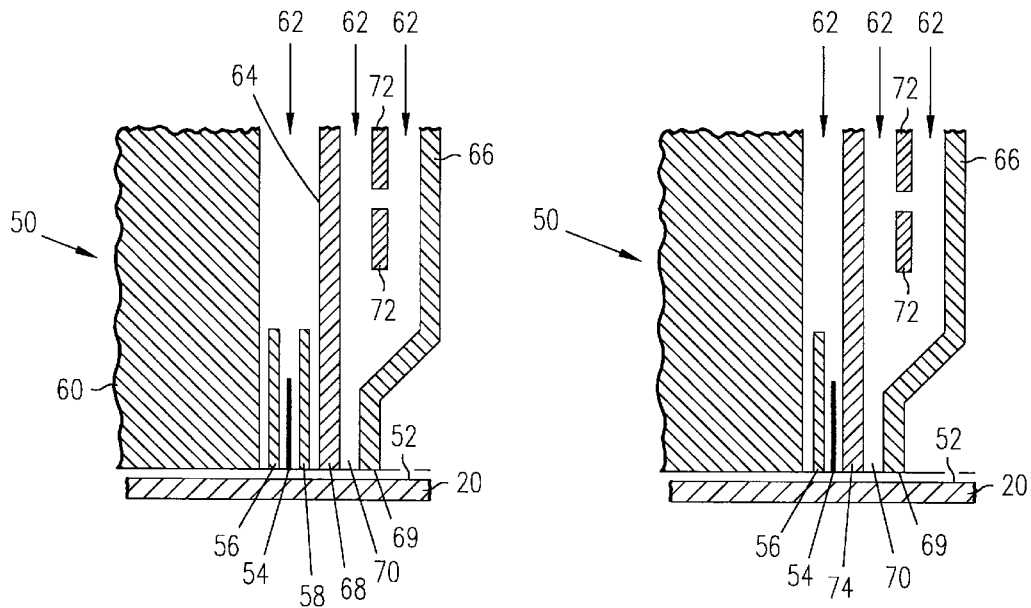
FIGS. 2a and 2b are cross-sectional views of MR read/inductive write magnetic transducers.

Referring now to FIGS. 2a and 2b, a portion of an MR read/inductive write magnetic head or magnetic head assembly or head 50 is shown in transducing relationship with a rotating magnetic disk 20 such that the head air bearing surface 52 (ABS) is disposed in facing relationship with and slightly above the disk recording surface. Generally, such a magnetic head assembly 50 includes an MR read assembly and an inductive write assembly formed adjacent to one another on a substrate surface. The substrate surface is typically the vertical surface forming the trailing end of the slider 26 carrying the magnetic head. The MR read assembly comprises an MR sensing element 54 fabricated of a ferromagnetic material, such as nickel-iron (NiFe) alloy, for example, which is enclosed by first and second magnetic shield elements 56 and 58, respectively. The MR sensing element can comprise a multilayer magnetic structure, including magnetic bias layers, of the type described in commonly assigned U.S. Pat. No. 4,785,366 or of the type described in commonly assigned U.S. Pat. No. 5,206,590, utilizing the giant MR effect. The shield elements 56 and 58 are generally made of a highly permeable magnetic material, such as NiFe or Sendust, a trialloy of aluminum-silicon-iron. The magnetic shield elements 56 and 58 minimize or eliminate magnetic interferences from affecting the MR sensing element 54 and thereby producing extraneous electrical pulses. Conductive leads, of tantalum (Ta) or copper (Cu) or other suitable conductive material, attached electrically at the end portions of the MR element 54 couple the MR sensing element to external circuitry to provide a means for sensing the resistance of the MR sensing element.

The MR read assembly is formed by well-known vacuum deposition techniques, such as sputter deposition, for example, on the substrate 60. Layers 62 of insulating material surround and insulate the various elements of the MR assembly from each other. For example, the layers 62 are made from silicon dioxide ($SiO_2$) or aluminum oxide ($Al_2O_3$).

The inductive write assembly comprises a lower or first pole piece 64 and an upper or second pole piece 66. The first and second pole pieces 64, 66 are made of a highly permeable magnetic material such as NiFe, for example. The first and second pole pieces 64, 66 form a magnetic circuit magnetically connected together at a back gap portion (not shown) with the first and second pole tips 68, 69 forming a magnetic gap 70 at the air bearing surface 52. One or more layers of electrical conductors 72, generally made of Cu, for example, form a write coil 64 disposed between the first and second pole pieces 64, 66. The write coil 64 also connects to external circuitry via conductive leads. The pole pieces 68, 69 and the write coil conductors are fabricated by well-known processes such as electro-plating or sputter deposition, for example. Layers 62 of insulating material electrically insulate the pole pieces from the write coil and the MR read assembly. In addition, a capping layer 62 of insulating and protective material covers the entire assembly.

The magnetic head assembly 50 shown in FIG. 2 is sometimes referred to as a "piggyback" head. FIG. 2b shows an alternate configuration referred to as a "merged" head where the second MR magnetic shield element 58 is merged with the inductive assembly first pole piece 68 to form a single element 74 which performs both functions. In addition, the present disclosure uses the terms "MR sensor element" and "MR sensing element" broadly to also include spin valve structures as described in the aforementioned U.S. Pat. No. 5,206,590 hereby incorporated by reference.

As previously described, static electrical charges built up on the various components of the magnetic head assembly 50 or on any object, equipment or person which may come into contact with or closely approach the magnetic head assembly or any electrical leads attached to the magnetic head assembly pose the potential for serious damage to the magnetic head assembly. These charges are built up during the manufacturing process and during subsequent handling of the heads. For example, the assembly of the head with other components to produce a disk drive assembly can result in relatively large amounts of static electrical charge accumulating on the head elements. The electrical charges migrate from the areas at which they are generated to build up along conductive paths. Thus a buildup of static charge occurs that subsequently results in a discharge from one conductive element across a dielectric, which experiences "breakdown," to another conductive element, in the manner of a capacitive discharge. The discharge typically causes damage by burnout or the like at the areas of the conductive material which act as terminals for the discharge of the stored static electrical energy. As discussed above with reference to U.S. Pat. Nos. 4,317,149 and 4,800,454, the problems concerning electrostatic discharge (ESD) for inductive heads are well-known and the referenced patents provide methods and structure for protection of inductive heads.

While the write coil conductors 72 withstand relatively high voltages and currents, the MR sensing element is particularly sensitive to current and voltage overloads because of its physically small cross-section. The active sensing portion of the MR element has a length in the range of 0.5 to 20 um, a height (width) of 0.5 to 5 um and a thickness of 10 to 100 nanometers (nm) and a resistance of about 20 to 80 ohms. In MR read assemblies of the types shown in FIGS. 2a and 2b, damage occurs along the sensing region of the MR sensing element 54 when the accumulated static charge is discharged through the MR sensing element 54 or from the MR sensing element to the magnetic shield elements, first pole piece or the slider body (substrate).

Figure 3A:
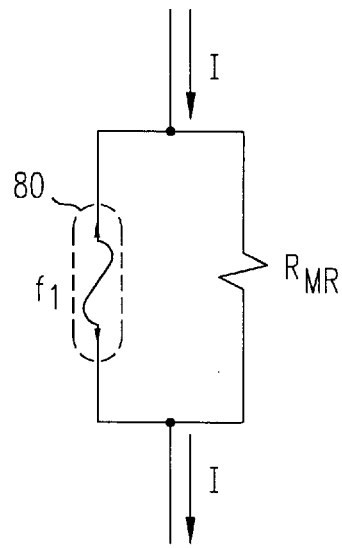
FIGS. 3a and 3b are simplified schematic diagrams illustrating the fusible-link circuitry for MR sensor elements according to the present invention.
Figure 3B:
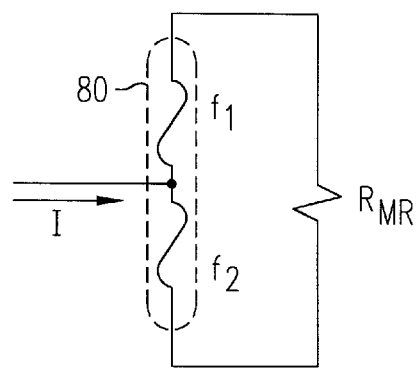
Figure 3C:
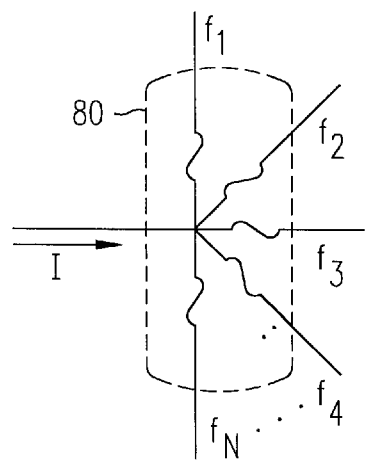
FIG. 3c is a simplified schematic of an implementation of a fusible-link having a plurality of terminals.

Referring now to FIGS. 3a, 3b and 3c, schematic diagrams illustrating preferred embodiments of the present invention are shown. In accordance with the principles of the present invention, a removable fusible-link 80 provides electrostatic discharge and electrical overstress protection for an MR head represented by resistor $R_{MR}$. The fusible-link shorts the MR sensing element electrical leads to shunt current around the MR sensing element 54. In the context of the present application, a fusible-link includes fuse elements comprising an over-current protective device with a circuit-opening fusible part which is heated and severed by the passage of over-current through it. In some preferred embodiments of the present invention, the fusible-link comprises a type of fuse. However, in other preferred embodiments of the present invention, the fusible-link comprises an over-current protective device with a circuit-opening fusible part which is heated and severed by the application of heat. In FIG. 3a, the fusible-link 80 comprises a two terminal device represented electrically by a single fuse $f_1$ element. In FIG. 3b, the fusible-link 80 comprises a three terminal device represented electrically by two fuse elements, $f_1$ and $f_2$ connected in series. In FIG. 3c, the fusible-link 80 comprises a multi-terminal device represented electrically by several fuse elements $f_1 \ldots f_n$.

Figure 4:
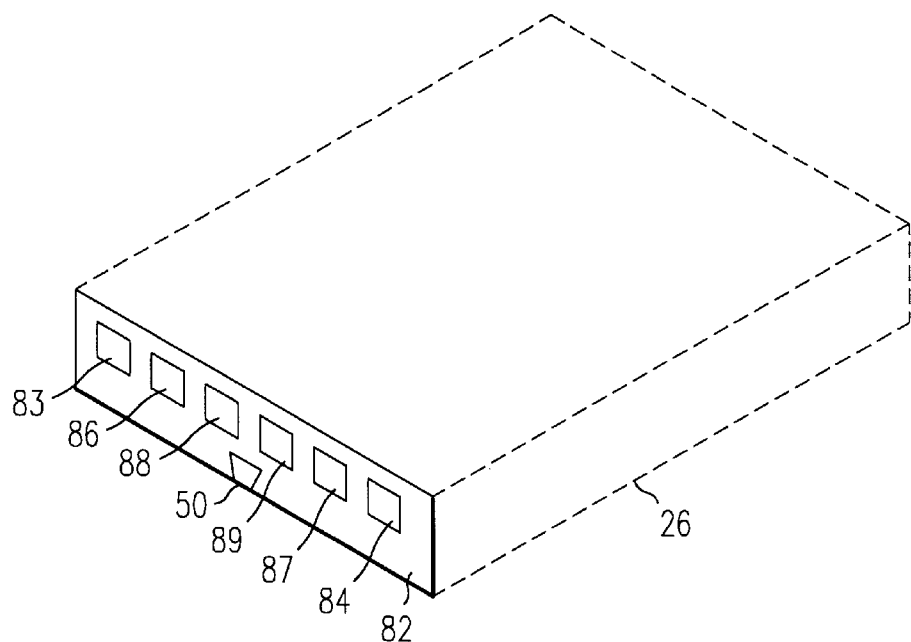
FIG. 4 is a simplified diagram illustrating the magnetic head terminal pads on the trailing edge wall of a slider.

Referring now to FIG. 4, the head 50 is formed in the slider 26 trailing edge with the conductive terminal pads exposed on the vertical surface 82. The terminal pads provide electrical connections for the magnetic head to external circuitry. Conductive leads (not shown) connect the write coil 72 to first and second write coil terminal pads 83,84. Similarly, the MR read element is provided with first and second MR terminal pads 86, 87 for connection to external circuitry. Conductive leads connect the MR sensing element to the MR terminal pads 86, 87. According to the embodiment of the present invention as shown in FIG. 4, the MR magnetic shield elements 56, and 58 or 74 connect to first and second shield terminal pads 88, 89, respectively. Additional terminal pads can be included such as a ground pad connection to the slider body for example.

Figure 5:
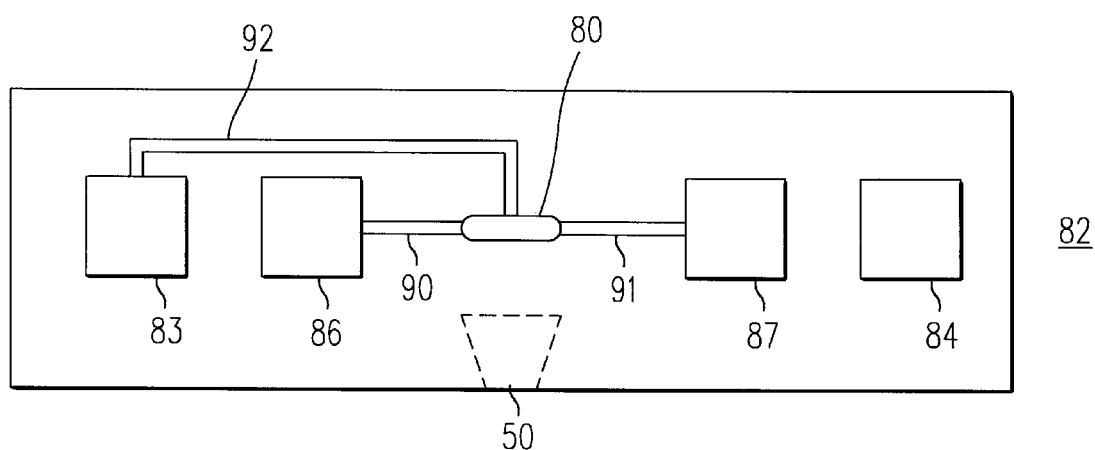
FIG. 5 is a plan view of the connective terminals for an MR head illustrating a preferred embodiment of the present invention.

Referring now also to FIG. 5, a diagram illustrating the vertical surface 82 of slider 26 is shown. The slider terminal pads 83, 84, 86, 87, 88, 89 may be of gold (Au), Cu or aluminum (Al), or other suitable electrically conductive material, as is known in the art. The terminal pads are connected to their respective shields, write coil and MR sensing elements by conductive leads of Au or Cu, or other suitable conductive material. The conductive leads are formed using well-known deposition techniques.

Conductive leads 90, 91 connect the MR terminal pads 86, 87 to the fusible-link 80. Another conductive lead 92 connects the first write coil terminal pad 83 to the fusible-link 80. Alternatively, the conductor lead 92 can connect the second write coil terminal pad 84 to the fusible-link 80. Although FIG. 5 shows the fusible-link connected to a write coil terminal pad, the fusible-link alternatively can be connected to the shield terminal pads, other terminal pads or to the slider body. The fusible-link 80 electrically contacts the conductive leads 90, 91, 92. The fusible-link 80 and conductive leads 90, 91 are formed by well-known deposition techniques on vertical surface 82 of slider 26. The fusible-link is preferably made from a low melting point material, such as Al, Sn, a nickel-iron alloy, for example, or other suitable material or alloy, for example. The fusible-link has a cross-section in the range from about 1 to 50 square microns. The conductive leads are made of a high conductance material, such as Au, Cu or other suitable material. The fusible-link 80 is formed subject to the following: the magnitude of current sufficient to melt and open the fusible-link 80 is less than the magnitude of current sufficient to melt the conductive leads 90, 91, 92.

The fusible-link 80 is formed as early in the manufacturing process as possible to provide ESD/EOS protection for as much of the fabrication and assembly process as possible. Because the MR sensing element 54 is tested during fabrication, depositing the fusible-link 80 too early precludes testing. Therefore, the fusible-link 80 is deposited after the device is successfully tested. A protective overcoat 81 covers the fusible-link 80 to contain the melted fuse material.

The fusible-links are opened prior to head operation in a magnetic storage system. In the present disclosure, the terms "opening" and "removing" are used synonymously. The fusible link 80 is opened by supplying electrical current to the fusible-link. Because the fusible-link 80 increases the protection of a MR sensing element 54 from electrostatic discharge, the fusible-link 80 is opened as late in the manufacturing process as possible. Preferably, the fusible-link 80 is opened after the slider 26 has been assembled on to the suspension 34 (as shown in FIG. 1) or at a later point in the disk drive assembly process.

Figure 6:
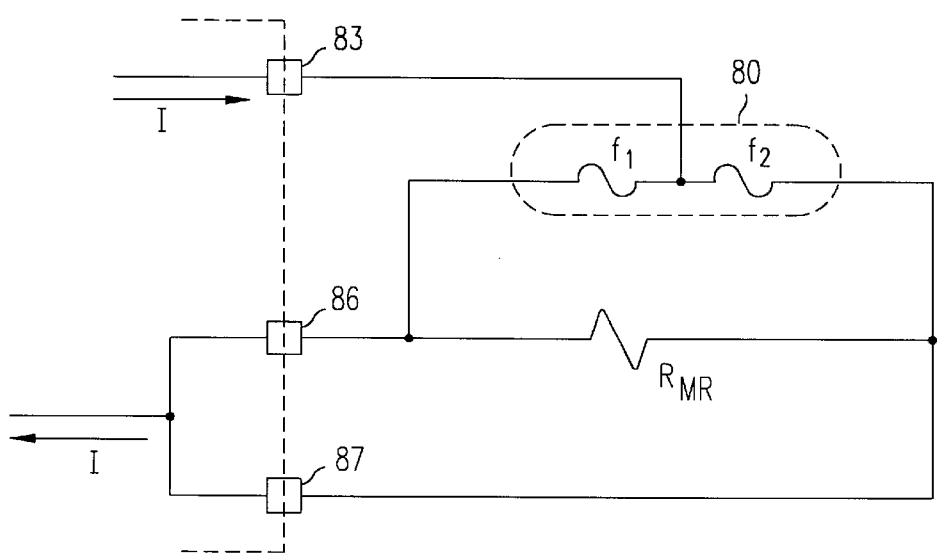
FIG. 6 is a schematic illustrating the opening of a fusible-link directly at the slider terminal pads.

Referring now to FIG. 6, a schematic diagram illustrating the use of the fusible-link configuration shown in FIGS. 3b and 5 is shown. The fusible-link 80 connects in parallel with $R_{MR}$. The fusible-link 80 is represented electrically as a three terminal device having two fuses $f_1$ and $f_2$ and further is connected to the first write coil pad 83.

In the preferred embodiment shown in FIG. 6, the MR sensor leads are shorted at terminal pads 86, 87 to allow the fusible-link 80 to be opened at the terminal pads on the slider surface 82. The MR terminal pads 86, 87 are shorted together by any means well-known in the art. A current source, for example, is then connected to the first write coil terminal pad 83 and shorted MR terminal pads 86, 87. The current flows from the write coil terminal pad 83 through both fuses $f_1$ and $f_2$ of fusible-link 80 and out to the shorted MR terminal pads 86, 87. Because the MR terminal pads are shorted together, very little current, if any, flows through the MR sensing element. The supplied current is sufficient to open both fuses $f_1$ and $f_2$ of the fusible-link. After opening the fusible-link, the short is removed from the MR terminal pads.

Figure 7:
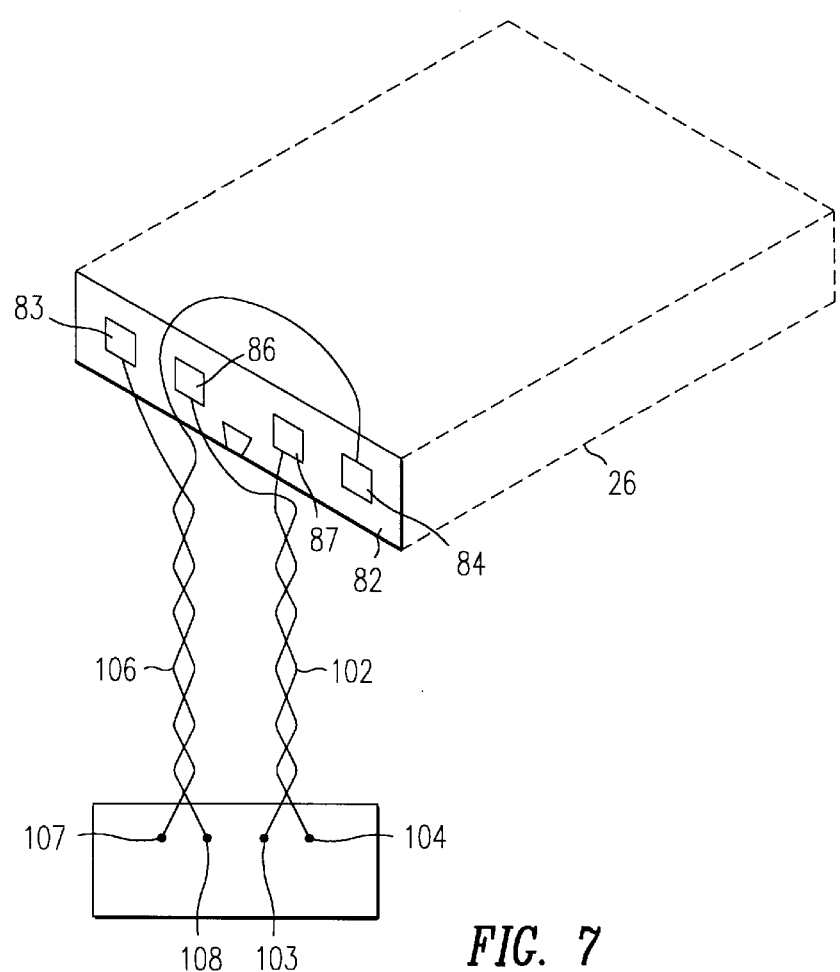
FIG. 7 is a simplified diagram illustrating connections from the slider to the terminal assembly.

Referring now to FIG. 7 a diagram illustrating the connections from the MR terminal pads 86, 87 on the slider 26 to terminal assembly 100 provided on suspension 34. A twisted pair of electrical wires 102 connects terminal assembly 100 first and second MR terminals 103, 104 to the slider MR terminal pads 86, 87. Similarly, twisted pair 106 connects write coil terminal pads 83, 84 to terminal assembly 100 first and second write coil terminals 107, 108. Terminals 103, 104, 107, 108 further connect the MR terminal pads and write coil terminal pads to external circuitry.

Figure 8:
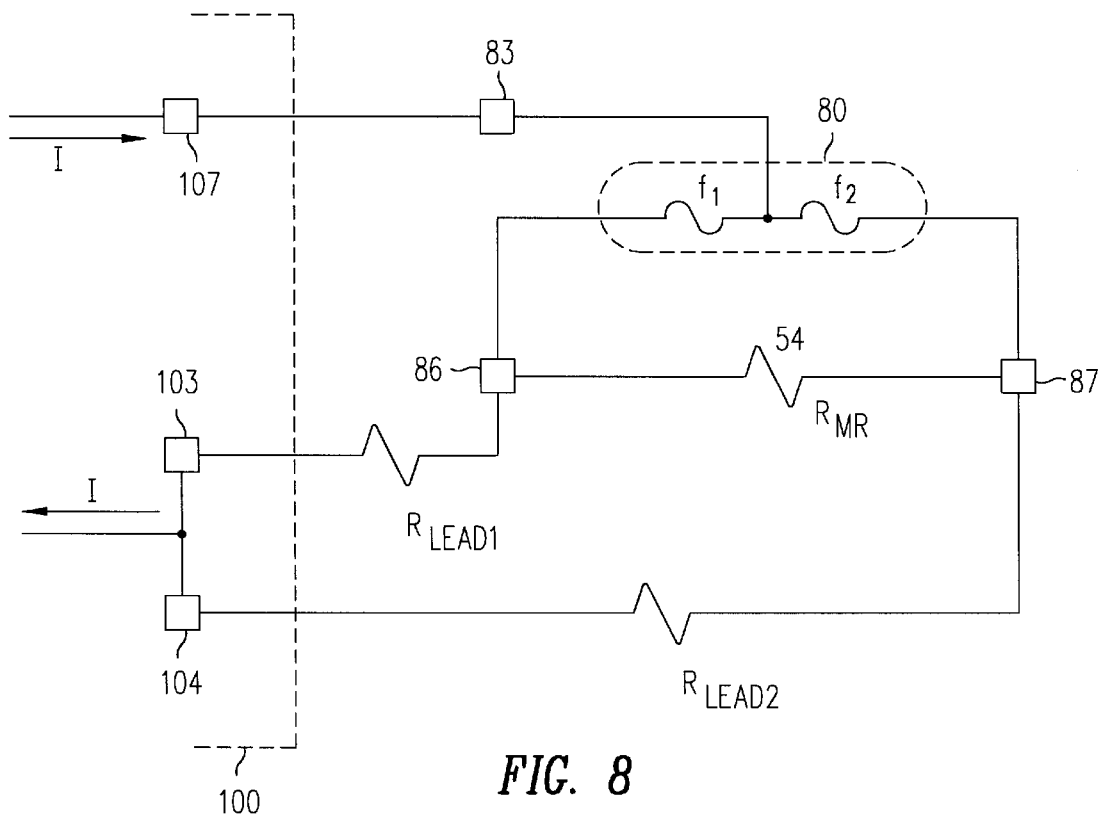
FIG. 8 is a schematic diagram illustrating a preferred embodiment for opening a fusible-link.

Referring now to FIG. 8, a schematic diagram is shown illustrating the preferred embodiment of FIG. 6 connecting to the terminal assembly 100 wherein fusible-link 80 shorts the MR sensing element 54, represented as $R_{MR}$. Fusible-link 80 is represented as two fuses $f_1$ and $f_2$ connected in series. A conductive lead connects the junction of the fuses $f_1$ and $f_2$ to the first write coil terminal pad 83. Conductive leads connect the fusible-link 80 to the MR sensing element terminal pads 86, 87. The lead resistance from the slider pads, 86, 87 to the terminal assembly 100 terminals 103, 104 is represented by $R_{LEAD1}$ and $R_{LEAD2}$ respectively.

To open fusible link 80, the MR sensing element 54 leads is shorted at terminal assembly 100, making each end of the MR sensing element substantially equipotential. Electrical current is then supplied to the fusible-link 80 via the terminal assembly terminal 107 connecting to the first write coil terminal pad 83. The current is a pulse of alternating current (AC) or direct current (DC). The current is supplied at a magnitude and duration sufficient to open both fuses $f_1$ and $f_2$ of the fusible-link 80. Ideally, no current would flow through the MR sensing element 54 during the opening process. However, in practice, current will flow through the MR sensing element due to the imbalance of the lead resistance, typically less than about 2 ohms, from the slider terminal pads 86, 87 to the terminal assembly 100. The current flowing through the MR sensing element 54 is kept below a threshold, generally about 15 mA, and in the direction of the normal bias current to avoid damaging the MR sensing element 54.

Figure 9A:
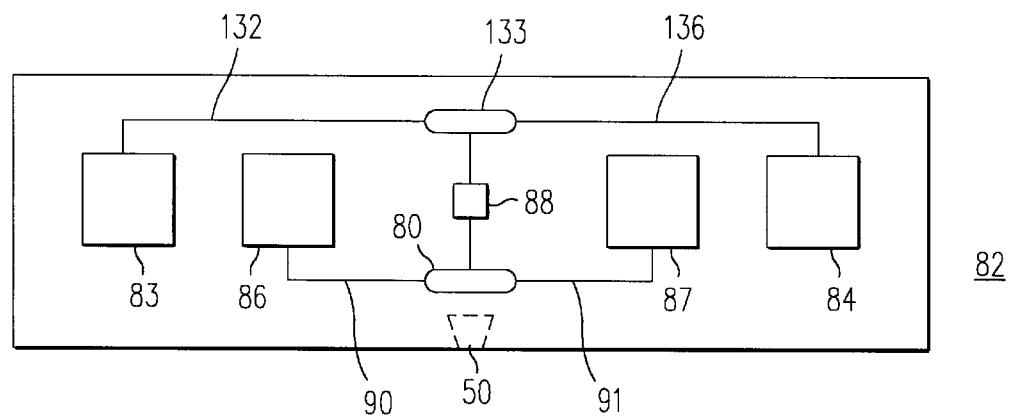
FIGS. 9a and 9b illustrate preferred embodiments using fusible-links to short the shields.
Figure 9B:
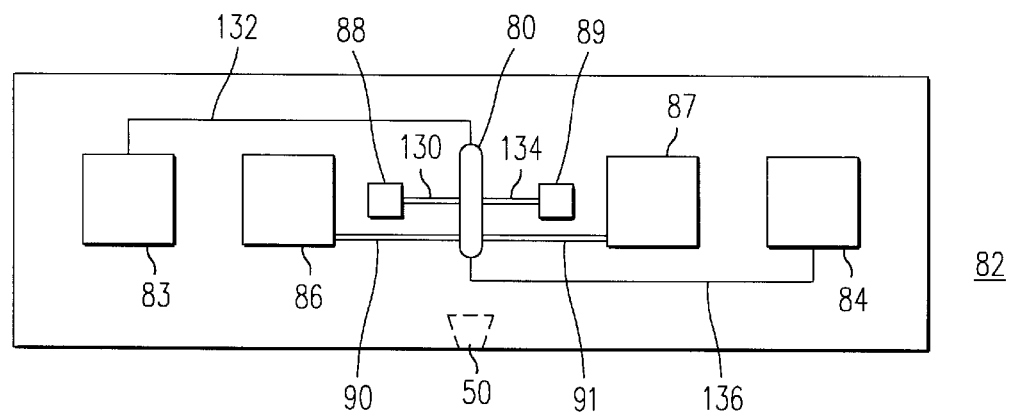

Referring now to FIGS. 9a and 9b, diagrams illustrating preferred embodiments wherein the MR magnetic shield elements are also shorted, are shown. FIG. 9a is a plan view of vertical surface 82 of slider 26 shorting one shield. Conductive leads 90, 91 connect the MR terminal pads 86, 87 to a first fusible-link 80. The first fusible-link 80 connects to a first shield terminal pad 88 via a conductive lead 130. The write coil terminal pads 83 connect via conductive leads 132, 134 to a second fusible-link 133. A conductive lead 134 connects the first shield terminal pad 88 to the second fusible-link 133. The fusible-links and conductive leads are formed in the same manner as previously described. The second fusible-link 133 is formed such that substantially the same magnitude of current required to open the first fusible-link 80 in a first time period, $t_1$, also opens the second fusible-link 133 in a second time period, $t_2$, where $t_2 > t_1$. Alternatively, the second fusible-link is formed such that the magnitude of current sufficient to open the first fusible-link 80 is less than the magnitude of current sufficient to open the second fusible-link 133.

In the preferred embodiment, the fusible-links open sequentially. First, the first fusible-link 80 is opened in a manner similar to that described with reference to FIG. 8. Then, to open the second fusible link 133, current is supplied to the write coil terminals 107, 108 on the terminal assembly 100. AC, DC or a pulse of current opens the fusible-links. However, when opening the first fusible-link 80, a DC current is preferable to maintain the correct bias polarity on the MR sensing element. The current sufficient to open the second fusible-link will not damage the write coil even after the second fusible-link 80 opens.

An alternative embodiment shorts both magnetic shields of the MR sensing element using fusible-links. Referring to FIG. 9b, a single fusible-link 80 shorts many elements of the magnetic head assembly. Conductive leads 132, 136 connect a fusible-link 80 to the write coil terminal pads 83, 84, MR terminal pads 86, 87, and shield terminal pads 88, 89. The fusible-link 80 and conductive leads 90, 91, 130, 132, 134, 136 are formed in the same manner as previously described.

To open the fusible link 80 shown in FIG. 9b, current is supplied to the fusible-link through the write coil pads. The current is either a DC or AC pulse and is at a magnitude and for a duration sufficient to open the fusible-link without melting the conductive leads. When the fusible-link opens, the shorts to the MR sensing element, shields and write coil are removed.

Figure 10A:
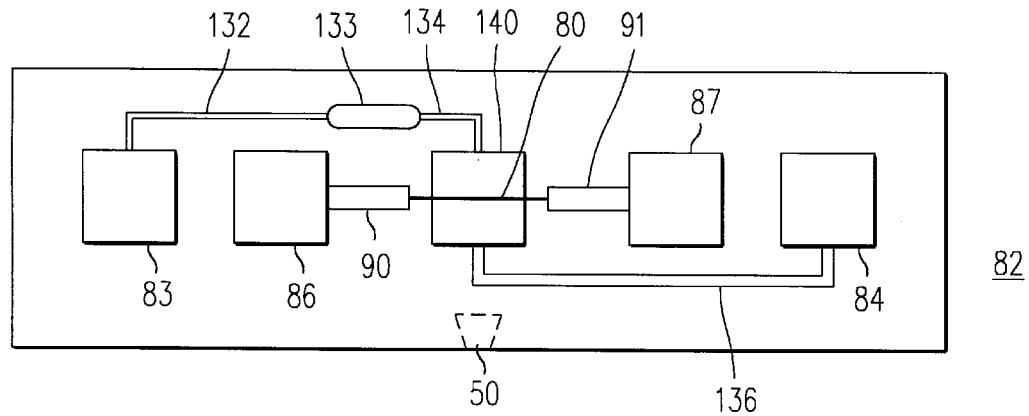
FIGS. 10a and 10b illustrate preferred embodiments using a heating element to open the fusible links.
Figure 10B:
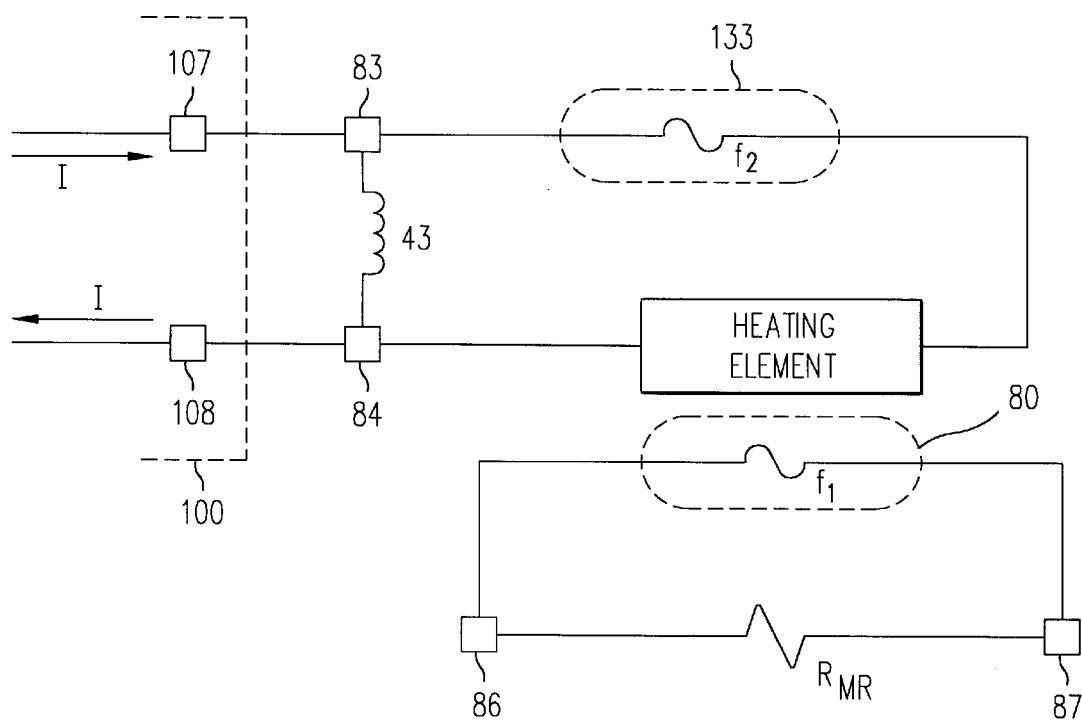

Referring now to FIGS. 10a and 10b, a diagram and corresponding schematic illustrating a preferred embodiment using a heating element to open the fusible-link 80, are shown. Use of a heating element allows fusible link 80 to be opened without shorting the MR sensing element 54. In the preferred embodiment as shown in FIG. 10a, a heating element 140 is formed on the slider surface 82 and the fusible link 80 deposited over the heating element. In an alternative embodiment, the first fusible-link 80 is formed adjacent the heating element. In some applications, the write coil may be used as the heating element. The first fusible-link opens when heated by melting or by thermal expansion, for example. In the embodiment shown in FIG. 10a, the first fusible-link 80 shorts the MR pads 86, 87 on the slider 82. The first fusible-link 80 is formed in a similar manner to that described above. The heating element 140 is formed using well-known deposition techniques of the same material as the fusible-links, Nickel-Chromium or other suitable material as known in the art. After the heating element is formed, an insulating layer alumina, for example, is deposited over the heating element. Conductive leads are deposited from the write coil terminal pads 83, 84 to the heating element 140 using well-known deposition techniques. Conductors 90, 91 from the MR terminal pads to the fusible-link are also deposited using well-known deposition techniques. The first fusible-link 80 is deposited after testing the MR sensing element. As described above, the fusible-links 80 are covered with a protective overcoat.

As shown in FIG. 10a, a second fusible-link 133 is formed on the slider surface 82 positioned sufficiently remote to the heating element 140 to prevent any heating of the fusible link. The second fusible-link 133 is connected in series with the heating element 140 via conductor 134. Conductors 132, 136 connect the heating element 140 and second fusible-link 133 between the write coil terminal pads 83, 84.

FIG. 10b is a schematic diagram of the circuit representation corresponding to the configuration of FIG. 10a. The second fusible link 133 and the heating element 140 are connected in series such that the current through the heating element also flows through the second fusible link. The fusible-links open sequentially. The first fusible-link 80 is opened by heat generated by the heating element 140. The second fusible-link 133 is opened by the current flow through it. To open first fusible-link 80, electrical current is supplied to the heating element 140 via the terminal assembly 100 write coil terminals 107, 108. The current is preferably AC or pulsed DC. The fusible-links 80, 133 are designed such that the magnitude of current sufficient to generate enough heat to open the first fusible-link 80 is also sufficient to open the second fusible-link 133 a short time after the first fusible link 80 opens. In an alternative embodiment, the second fusible-link 133 is formed such that the magnitude of current sufficient to open the second fusible-link 133 is greater than the magnitude of current sufficient to generate enough heat to open the first fusible-link 80.

In an alternative embodiment, the first fusible-link opens when the heating element heats the first fusible-link in conjunction with supplying current to the first fusible-link. Heating the fusible-link reduces the amount of current sufficient to open the fusible link. To heat the first fusible-link, current is supplied to the heating element 140 from the terminal assembly 100 write coil terminals 107, 108. When current is also supplied to the first fusible-link from the terminal assembly MR terminals 103, 104, the first fusible-link 80 opens.

In another alternative embodiment (not shown), additional fusible-links across the heating element 140 short the shields to the MR terminal pads 86, 87.

Figure 11:
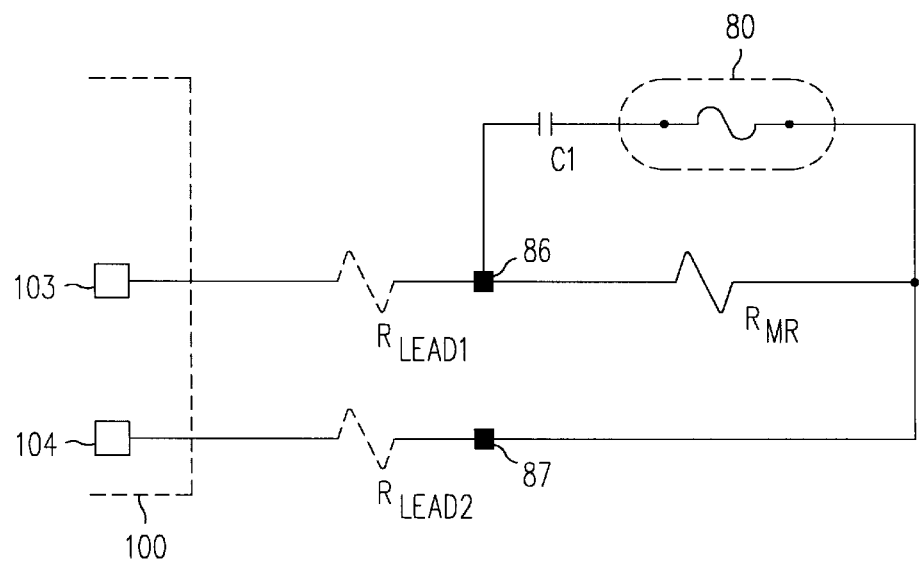
FIG. 11 is a schematic diagram illustrating a preferred embodiment using a capacitor and a fusible-link.

Referring now to FIG. 11, a schematic diagram illustrating a preferred embodiment which provides an AC short across the MR sensing element, is shown. A capacitor C is connected in series with the fusible-link 80. The capacitor is essentially an open to DC allowing the fusible-link and the capacitor to be formed prior to testing the MR sensing element, thus providing ESD/EOS protection at an earlier point in the MR head manufacturing process. The fusible-link is formed as previously described. The capacitor is formed by techniques well-known to those skilled in the art. A conductive lead connects the capacitor to the fusible-link 80. Conductive leads connect the capacitor and fusible link 80 to the MR pads 86, 87. The capacitor and fusible-link are encapsulated in a protective overcoat.

To open the fusible-link, AC is supplied to the capacitor and fusible-link 80 via the MR terminals 103, 104 on the terminal assembly 100. The current is such that the capacitor substantially shorts the MR sensing element at the applied frequency. The frequency, magnitude and duration of the current supplied to the capacitor is sufficient to open the fusible-link without damaging the MR sensing element 54.

While the present invention has been particularly shown and described with reference to preferred embodiments thereof, it will be understood by those skilled in the art that various changes in form and detail may be made therein without departing from the spirit, scope and teaching of the invention. Accordingly, the invention herein disclosed is to be considered merely as illustrative and limited in scope only as specified in the appended claims.

We claim:

1. A method for protecting a magnetoresistive sensor element in a magnetic head assembly from damage caused by electrostatic discharge, said method comprising the steps of:

electrically connecting a first fusible-link to a magnetoresistive (MR) sensor element for providing a removable short across said MR sensor element during the assembly process, said first fusible link having a third terminal for receiving current to open said first fusible link; and electrically connecting an electrical conductor to said MR sensor element for Providing a short during the opening of said first fusible link, said electrical conductor being removable after said first fusible link has been opened.

2. The method as in claim 1 wherein said magnetoresistive sensor element connects to a first and a second terminal pad.

3. The method as in claim 2, further including the steps of:

electrically connecting a capacitor to said first fusible-link and said terminal pad for substantially shorting said first magnetoresistive sensor element to AC current; and opening said first-fusible link by supplying alternating current to said terminal pads to open said first fusible-link.

4. The method as in claim 1, further including the steps of:

biasing said first fusible-link by supplying current to a write coil, said write coil heating said first fusible-link; and opening said first fusible-link by supplying current to said magnetoresistive sensor element.

5. The method as recited in claim 1 wherein said first fusible-link is removable using electrical current in conjunction with heat.

6. The method as recited in claim 5 further comprising a write coil.

7. The method as recited in claim 6 further including the step of using said write coil to generate heat to open said first fusible-link when current flows through the write coil.

8. The method as recited in claim 1 further including the step of:

heating said first fusible-link using a heating element.

9. The method as recited in claim 8 wherein said heating element opens said first fusible-link when current flows through said first fusible-link.

10. The method as recited in claim 1 further including the steps of:

connecting a magnetic shield element to said first fusible-link; and connecting a second fusible-link to said magnetic shield element.

* * * * *